United States Patent [19]
Koes et al.

[11] Patent Number: 5,981,135
[45] Date of Patent: *Nov. 9, 1999

[54] HIGH RESOLUTION POSITIVE ACTING DRY FILM PHOTORESIST

[75] Inventors: Thomas A. Koes, Riverside; Grieg B. Beltramo, Orange, both of Calif.

[73] Assignee: Morton International, Inc., Chicago, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/910,188

[22] Filed: Aug. 13, 1997

[51] Int. Cl.$^6$ .................................................. G03F 7/023
[52] U.S. Cl. ..................... 430/165; 430/191; 430/192; 430/270.1; 430/277.1; 430/199
[58] Field of Search ................................. 430/191, 192, 430/193, 165, 166, 175, 270.1, 176, 911, 276.1

[56] References Cited

U.S. PATENT DOCUMENTS

| | | | |
|---|---|---|---|
| 3,744,073 | 7/1973 | Loprest et al. | 430/176 |
| 3,778,270 | 12/1973 | Roos | 430/176 |
| 4,177,073 | 12/1979 | Hata et al. | 430/192 |

*Primary Examiner*—John S. Chu
*Attorney, Agent, or Firm*—Robert M. Didrick; Gerald K. White

[57] ABSTRACT

A positive acting photoresist composition (e.g., a monolayer dry film) which is strippable in aqueous alkaline solution comprises a photo acid generator and a UV-transparent resin binder system which allows efficient photo bleaching of the photoactive component. An acid functional cellulosic resin may be the only binder resin, an acidic acrylate resin being optional. The dry coating is flexible and may be used as an etch and plating resist.

57 Claims, No Drawings

HIGH RESOLUTION POSITIVE ACTING DRY FILM PHOTORESIST

FIELD OF THE INVENTION

This invention relates to a positive acting photoresist in the form of a monolayer dry film, which may be exposed and developed with the chemistry and equipment conventionally used for negative acting dry film photoresists. It relates more particularly to the lamination of such dry film to make printed circuit boards. It also relates to the use of such photoresist compositions as liquid resists to be applied directly onto the substrate of choice. It also relates to innerlayer print and etch applications, outerlayer decoupled plating applications, buried and landless vias, presensitized laminate derived from either laminated dry film photoresist or applied liquid resist, and additive build. It relates also to the use of such photoresists in the manufacture of thin film heads for reading hard disc media and other radiation sensitive recording materials.

BACKGROUND OF THE INVENTION

Initially, negative acting photoresists were applied as liquids to copper substrates and radiated imagewise to form relatively insoluble material in the exposed areas and left relatively soluble material which was washed away upon treatment with a developer to reveal the copper substrate in the non-exposed areas. The copper was then etched away and the relatively insoluble material covering the remaining copper traces was stripped by a stronger solvent.

The processing of positive acting photoresists generally follows the sequence of applying a solution of the resist to a copper foil laminated to an epoxy resin base, drying and baking the resist to expel the solvent, exposing the resist to actinic radiation through a patterned photomask to define an image, dissolving the exposed portions of the resist in an alkaline developer to delineate the image, rinsing, and in some instances post-baking the imaged resist. The areas void of resist, comprised of exposed copper substrate, are then either etched or electroplated. If the exposed copper is etched, the unexposed portions of the resist which cover the remaining copper foil may then be stripped away by a more active alkaline solvent to reveal the desired pattern of copper traces. If the copper exposed during development is electroplated with gold, for example, the newly exposed in the stripping step is then removed by etching.

The early use of a laminatable, negative acting single layer film on a substrate to make a dry film photoresist is discussed in U.S. Pat. No. 3,469,982. That was followed a few years later by the use of laminatable films of a positive acting compositions to make dry film photoresists as disclosed in U.S. Pat. No. 4,193,797.

Particular requirements in the positive acting photoresist art, however, have led to the use of two layer or multilayer laminatable sheets of photoresist materials in order to make dry films having improved sensitometric and physical properties.

An oleophilic, moderately flexible dry film photoresist comprising two intermixed and intertwined resin networks and a positive acting photosensitizer is described in 3M's U.S. Pat. No. 4,247,616. The first network comprises a cross-linked urethane derived from a novolac resin and a polyisocyanate compound; the second is a heat curable epoxy resin plus a curing agent therefor. The photosensitizer generates acidity in the irradiated areas.

Although, the dry film of the 3M patent is a monolayer, a later 3M patent, U.S. Pat. No. 4,672,020, teaches that positive acting dry film photoresists having the monolayer construction could not meet the then existing commercial needs for resistance to crazing during storage, photosensitivity, and thermal dimensional stability. The solution to the problems taught by the later 3M patent is a positive acting multilayer dry film photoresist comprising at least two functional layers and, optionally, a strippable carrier layer. The first functional layer comprises an o-quinone diazide in a phenol formaldehyde resin binder which becomes more soluble in an aqueous alkaline solution upon exposure to actinic radiation. The second layer, comprising an acrylic copolymer or terpolymer and a phenol formaldehyde resin crosslinked with a polyisocyanate, is adjacent and adhered to the first layer.

The performance limitations exhibited by typical negative acting dry film photoresists include:
1. resolution limitations, limited aspect ratio;
2. resist and debris related defects in the manufacture of innerlayers which lead to opens, near opens, and pits;
3. resist and debris related defects in the manufacture of outerlayers which lead to short circuits, reduced spacing, and under plating;
4. polyethylene coversheet required to allow for roll packaging of the photoresist composition;
5. limited process latitudes (exposure, development); and
6. leaching of organics during plating cycles.

For most circuit board manufacturers, the use of positive acting liquid photoresists in the fabrication of printed circuit boards has been a financially difficult proposition because of the capital expenditure required to purchase, set-up and maintain an electrodeposited photoresist system, a liquid photoresist roller coater, drying oven and ancillary cleanroom.

Another performance limitation of positive acting liquid photoresists in the fabrication of printed circuit boards has been artwork tenting during on-contact patterned exposure. The transporting of panels coated on both sides with liquid resist through the drying oven requires that each panel be suspended by means of a mechanical gripping system. Thus, each panel is held in areas where resist has already been coated. As a result, liquid resist is transferred onto the conveyor mechanism itself. Over time this leads to airborne, resist debris within the confines of the drying oven. This debris then deposits on subsequently coated panels, while still wet, leading to debris laden dry resist coatings. During on-contact exposure, this embedded debris can lead to artwork tenting resulting in light scatter and defocus problems.

The slow photospeed of positive acting liquid photoresists compared to that of negative acting dry films, even when thin coatings (e.g., 0.5 mil) are applied, has been still another of their performance limitations.

SUMMARY OF THE INVENTION

The advantages of the positive-acting dry film photoresist of this invention include:
UV-transparent resin binder system allows for efficient photobleaching of the photoactive component, affording lower exposure doses;
flexible, tack free, excellent tensile strength;
does not crumble or flake when handled;
does not stress crack when tightly rolled up or folded;
adheres to a carrier sheet such as polyester prior to lamination;
adheres to copper clad dielectric using conventional lamination techniques;

the solvated resist formulation may be directly applied to copper clad dielectric and dried, thus resulting in a photosensitive laminate for which the resist coating exhibits tack-free adhesion to the substrate and flexibility;

shelf-life of at least one year;

variations on the resist formulation enable vacuum lamination capability;

exhibits little to no odor at room temperature or when heated during lamination; also is relatively non-toxic;

no cold flow or telescoping;

uses conventional lamination equipment, pressures, and temperatures;

uses conventional exposure equipment and light sources;

conventional development equipment, chemistries, temperatures, spray pressures, concentrations, and durations used for negative photoresists may be employed;

capable of on-contact patterned exposure using irradiation doses in the realm of current negative acting dry films without evolution of nitrogen during or after exposure; not sensitive to oxygen;

capable of multiple exposures, e.g., exposure of unexposed areas after a plating cycle;

attenuates the need for artwork compensation or biasing commonly used with negative acting dry films;

exhibits one-to-one linearity with the phototool used;

more tolerant to overexposure as compared to negative acting dry films, even from non-collimated light sources;

straight or slightly sloped sidewalls after aqueous alkaline development attenuating the resist foot typically observed with negative acting photoresists;

space growth (the inverse of line growth exhibited by the negative acting dry films) occurs only when gross off-contact exposures are performed;

wide exposure latitude; less sensitive to scattered or stray light sources;

excellent resolution (aspect ratio) and adhesion properties;

permits circuit densification (finer etched spaces, finer conductor widths), and landless vias;

minimal (<5%) unexposed film loss after aqueous alkaline development;

excellent gloss and abrasion resistance after aqueous alkaline development and after acid etching;

less sensitive to over development than negative acting dry film photoresists;

opens, near opens, pits in the manufacture of innerlayers minimized;

short circuits, reduced spacing, under plating in the manufacture of outerlayers minimized;

conventional equipment, chemistries, temperatures, spray pressures, concentrations, and durations used in acid etching;

conventional equipment, chemistries, temperatures, concentrations, and durations used in the electrochemical plating of metals such as copper, tin, nickel, and gold; and a lesser number of ingredients relative to typical negative acting dry film photoresist compositions, thereby lowering the standard cost and overhead required to test and stock raw materials;

no leaching into chemical plating baths during plating cycles.

It is an object of this invention, therefore, to overcome performance limitations exhibited by typical negative acting dry film photoresists.

It is another object of this invention to overcome limitations exhibited by positive acting liquid photoresists in the fabrication of printed circuit boards.

It is a related object of this invention to provide a dry film, positive acting photoresist having one or more of the above-recited advantages.

It is another object of this invention to provide a positive acting liquid resist composition which may be directly applied to a copper covered board by roller coating, dip coating, curtain coating, or airless spraying.

It is another object of this invention to provide a copper clad dielectric which has been presensitized with a positive acting liquid resist composition.

It is another object of this invention to provide a positive acting liquid resist composition which may be converted to a dry film and laminated to a copper covered board.

These and other objects of the invention which will become apparent from the following description are achieved by a positive acting photoresist composition (e.g., a monolayer dry film) which is strippable in aqueous caustic solution and comprises a photo acid generator and a UV-transparent resin binder system which allows complete photobleaching of the photoactive component at low exposure doses. An acid functional cellulosic resin may be the only binder resin in the photoresist composition of this invention, an acidic acrylate resin having a $T_g$ of from about −10 to about 110° C. being an optional component of the binder system. The resin solids (i.e., the non-volatile portion of the resin) in the binder system of the positive acting photoresist composition of this invention may therefore comprise from about 75% to about 100% by weight of the acid functional cellulosic resin solids and from 0% to about 25% of the acidic acrylate resin solids. The binder system preferably contains from 0% to about 20% of the acidic acrylate resin solids, 0% being the more preferable.

Said acid functional cellulosic resin has the following structural formula:

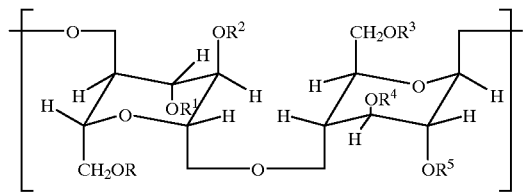

wherein R, $R^1$, $R^2$, $R^3$, $R^4$, and $R^5$ are hydrogen, alkyl having from 1 to 6 carbon atoms; hydroxyalkyl having from 2 to 6 carbon atoms; acyl having from 2 to 4 carbon atoms; or —C(=O)R'(COOR")$_m$ in which R' is alkylene having 2 or 3 carbon atoms, phenylene, or cyclohexylene, and m is 1 or 2; when m is 1, R" is hydrogen, and when m is 2, at least one R" is hydrogen while the other is alkyl having from 1 to 4 carbon atoms; with the proviso that at least one of R, $R^1$, $R^2$, $R^3$, $R^4$, and $R^5$ is —C(=O)R'(COOR")$_m$, and that at least one other of R, $R^1$, $R^2$, $R^3$, $R^4$, and $R^5$ is alkyl, hydroxyalkyl, acyl, or —C(=O)R'(COOR")$_m$.

DETAILED DESCRIPTION OF THE INVENTION

The photo acid generators (PAG's) suitable for use in this invention are soluble in the binder resin but insoluble in aqueous alkaline solvents before exposure to actinic radiation and thus inhibit dissolution of, or shield the acidic binder resins of the photoresist during the alkaline development procedure. Upon exposure, however, the PAG becomes soluble in the alkaline solvent by virtue of its function as an acid generator. All of the components of the exposed photoresist thus become more soluble in the developer and their dissolution leaves behind a pattern of the insoluble photoresist corresponding to the projected image. Examples of the suitable PAG's include those conventionally used in the manufacture of photoresists as exemplified by the onium salts of Group VIa elements having an $MF^{-6}$ (e.g., triarylsulfonium hexafluoroantimonate) taught in U.S. Pat. No. 4,273,668 which is incorporated herein by reference. They are further exemplified by the photo acid generators taught in U.S. Pat. No. 3,915,706 also incorporated herein by reference. It is preferred, however, to use either diazoquinone sulfonyl esters of trihydroxy benzophenone or diazoquinone sulfonyl esters of 6-nitro-2-methylol p-cresol, and p-cumyl phenol, and similar PAG's described in U.S. Pat. No. 5,308,744, also incorporated herein by reference. An isomeric mixture of 2,1,5-diazoquinone sulfonyl ester of trihydroxy benzophenone (hereinafter called 215DNQTHB) is available from Chemdesign Corporation of Fitchburg, Mass. A 215 DNQ sulfonate ester of 6-nitro-2-methylol p-cresol having about 2 sulfonate functions per molecule (hereinafter 2.0f) is more preferred. The photo acid generator constitutes from about 5 to about 40% of the total weight of the photoresist composition of this invention. The more preferred amount is from about 5 to about 20%.

The acid functional cellulosic derivatives serve as flexible, UV transparent alternatives to the acid functional novolac resin binders having repeating cresylic units commonly used in semiconductor microresists. The acid functional cellulosic resins suitable for use as the principal binder resin in the dry film of this invention are acidic esters of cellulose ethers with polybasic carboxylic acids and, optionally, monobasic carboxylic acids. Free carboxyl groups are pendant from the polybasic acid ester groups along the modified cellulose chain. The etherification and esterification of the cellulose molecules attenuate the solubility of such a resin in an aqueous alkaline developer, and in aqueous solutions in general. Cellulose ethers suitable as the base material for the cellulosic resins used in this invention have alkoxy and/or hydroxyalkoxy groups in place of hydroxy groups in the glucose units of cellulose. They include ethers described by the average unit formula $$R^1{}_m R^2{}_n A \qquad \qquad I$$

in which $R^1$ is a hydroxyalkoxy group having from 2 to 6 carbon atoms; $R^2$ is an alkoxy group having from 1 to 6 carbon atoms; A is a glucosidic residue of the cellulose structure; m is a positive number corresponding to the degree of substitution of hydroxyalkoxy groups for hydroxy groups; and n is zero or a positive number not exceeding about 2.5 and corresponding to the degree of substitution of alkoxy groups for hydroxy groups, the sum of m+n being at least about 0.05.

Illustrative of the above-defined cellulose ethers are alkylcelluloses, such as methylcellulose, ethylcellulose, and propylcellulose; hydroxyalkylcelluloses, such as hydroxyethylcellulose, hydroxypropylcellulose, and hydroxybutylcellulose; and hydroxyalkylalkylcelluloses, such as hydroxyethylmethylcellulose, hydroxymethylethylcellulose, hydroxypropylmethylcellulose, hydroxypropylethylcellulose, hydroxybutylmethylcellulose, and hydroxybutylethylcellulose; and those having two or more hydroxyalkyl groups, such as hydroxyethylhydroxypropylmethylcellulose.

The cellulose ethers are not limitative in molecular weight and in the degree of substitution with the alkoxy and/or hydroxyalkoxy groups thereof. It is preferred that, in an alkylcellulose or a hydroxyalkylcellulose, the number of the alkyl groups in substitution of the hydroxy groups per glucose unit of the cellulose ether does not exceed 2.5 on an average, since a larger content of the alkyl groups brings about some difficulty in the esterification reaction with the acid anhydrides aforementioned as the esterification agents. It is also preferred that the total degree of substitution in the cellulose ether, i.e., the sum of the numbers m and n in formula (I) above, is at least 0.05 in consideration of easy esterification reaction and in the solubility of the resultant product in organic solvents. Incidentally, it should be noted that larger contents of hydroxyalkyl groups in the cellulose either have little influence on the reactivity of the cellulose ether in the esterification reaction.

As the succinic anhydride and the anhydrides of aliphatic monocarboxylic acids used for the esterification of the cellulose ethers, commercial grade reagents can generally be used as such. The anhydrides of aliphatic monocarboxylic acids include anhydrides of acetic acid, propionic acid, butyric acid, valeric acid and the like, which preferably have a relatively small number, say, 2 to 4, of carbon atoms in the molecule from the standpoint of industrial availability, inexpensiveness and easiness in handling.

The esterification reaction of the cellulose ether is carried out by either of the following procedures. According to one of the procedures, the cellulose either is dispersed or dissolved in a carboxylic acid as the reaction medium, such as acetic acid, propionic acid, or butyric acid, followed by reaction with succinic anhydride and an anhydride of the aliphatic monocarboxylic acid in the presence of an alkali carboxylate, such as sodium acetate or potassium acetate, as the esterification catalyst. According to the other procedure, the cellulose either is reacted with succinic anhydride and an anhydride of the aliphatic monocarboxylic acid as dispersed or dissolved in an organic solvent, such as acetone or dimethylformamide in the presence of a basic catalyst, such as pyridine or α-picoline. The organic solvent possesses a good dissolving power for the cellulose ether at least at a stage where the esterification reaction has proceeded to some extent.

In the former procedure, the cellulose ether as the base material is introduced into the reaction vessel together with about 100 to 2,000 parts by weight of the carboxylic acid as the reaction medium and about 20 to 200 parts by weight of the alkali carboxylate as the catalyst, all being expressed per 100 parts by weight of the cellulose ether, followed by further introduction of predetermined amounts of succinic anhydride and an anhydride of the aliphatic monocarboxylic acid, the resulting mixture being heated at about 60° to about 110° C. for a period of time sufficient to complete the reaction, that is, usually from about 2 to 25 hours or longer.

In the latter procedure, 100 parts by weight of the cellulose ether as the starting material is dissolved or dispersed in 50 to 1,000 parts by weight of an organic solvent, such as acetone or dimethylformamide, containing the basic catalyst, such as pyridine and α-picoline, in an amount at least equivalent to the acid anhydrides to be reacted, followed by further addition of predetermined amounts of succinic anhydride and an anhydride of the monocarboxylic acid, the resulting mixture being heated at about 40° to 120° C. for 2 to 120 hours. After completion of the esterification reaction, a large volume of 5–15% sulfuric acid or hydrochloric acid is added to the reaction mixture to precipitate the reaction product, which is then washed with water thoroughly to remove impurities and dried to form a high purity powdery or granular product.

The two anhydrides, i.e., succinic anhydride and aliphatic monocarboxylic acid anhydride, may be introduced into the reaction vessel at the same time or separately one after the other during or after the reaction of either anhydride first introduced. The amount of each anhydride to be introduced is determined depending on the desired degree of esterification to be obtained in the final product, usually being 1.0 to 5.0 times the stoichiometric amounts.

For the purposes of this invention, the term polybasic acid means a carboxylic acid having 2 or 3 carboxyl groups and includes the anhydrides thereof. Examples of the acids suitable for this invention include but are not limited to succinic, phthalic, hexahydrophthalic, trimellitic, and glutaric acid, and mixtures thereof. The anhydrides may be used in place of or in addition to the acids in the preparation of the cellulosic ether esters useful in this invention.

Such properties of the cellulose ether derivatives as solubility in organic solvents and aqueous bases, moisture permeability resistance, compatibility to photopolymerizable unsaturated compounds, and stability are much affected by the amounts of the substitution radicals contained in the cellulose ether from which they are prepared, so that the (molecular) number of the substitution moles per anhydrous glucose unit (abbreviated as M.S.) of hydroxyalkyl radicals contained in hydroxyalkyl cellulose is preferably from 0.2 to 5.0, or more preferably from 1.0 to 4.0. In the case of hydroxyalkyl alkylcellulose, the M.S. of hydroxyalkyl radicals is preferably at least 0.02, or more preferably at least 0.05. Furthermore, it is desirable in this case that the total of M.S. of hydroxalkyl radicals and that of alkyl radicals is from 0.5 to 5.0 or more preferably from 1.0 to 4.0.

On the other hand, the M.S. of acyl radicals in said cellulose ether derivatives are preferably at least 0.2, or most preferably at least 0.3, while in the case of mixed esters, the M.S. of the acyl radicals are preferably at least 0.2, or most preferably at least 0.3.

The cellulose ether derivatives may be obtained by putting the cellulose ethers and polybasic acids in the prescribed amounts into an organic acid medium and reacting the mixture in the presence of an anhydrous alkali metal salt of acetic acid as the catalyst. The ratios in quantity of these raw materials vary in accordance with the kinds of the raw materials employed as well as with the properties desired of the product. Usually, 100 parts by weight of said cellulose ether is mixed with from 30 to 200 parts by weight of said dibasic and/or tribasic anhydride. As the organic acid medium, acetic acid, propionic acid or butyric acid is employed, and from 50 to 1,000 parts by weight, or more preferably, from 200 to 600 parts by weight of the organic acid is used per 100 parts by weight of the cellulose ether charged.

The anhydrous alkali metallic salt of acetic acid employed as the catalyst is used in amounts from 5 to 40 parts by weight added to 100 parts by weight of said organic acid medium. The reaction temperature is usually kept between 60 to 100° C. in the early period of the reaction and between 40 and 80° C. in the late period of the reaction. Such a temperature arrangement will make it possible for the reaction to proceed remarkably well in the early stages and for the esterification of the reactants to be promoted in the later stage. The reaction time is usually between 2 and 20 hours, depending upon the reaction conditions.

As both the starting materials and the reaction product are soluble in the organic acid medium, the reaction proceeds in a uniform system, and when the reaction is over, the whole system will be a transparent viscous liquid. If this liquid is poured into a large amount of water, or a large amount of water is poured into it, the reaction product precipitates. This may then be filtered off, washed with water, dried and recovered as a white powder.

The cellulose ether derivative prepared by the above mentioned method is a monoester compound in which one of the acid radicals contained in the acid anhydride, which was employed as the starting material, is combined with a hydroxyl radical of the cellulose or of the hydroxyalkyl radicals in said cellulose ether to form an ester, carboxyl radicals. Examples of these derivatives are the tetrahydrophthalic monoester and hexahydrophthalic monoester of said cellulose, ether, and a mixed monoester prepared by partial reaction of phthalic anhydride and trimellitic anhydride. The esters thus prepared are highly soluble in single or mixed solvents such as acetone, methyl alcohol, ethyl alcohol, isopropyl alcohol, methyl Cellosolve, ethyl Cellosolve, dioxane ether, methylethyl ketone, diacetylene alcohol, benzene, toluene, methyl lactate, methyl acetate, ethyl acetate, methylene chloride, trichlorethylene, methyl chloroform, chloroform and ethylene chloride, and especially in an aqueous solution of an alkali and they show moisture permeability resistance and stability superior to that of known cellulose ethers.

Hydroxyalkyl alkylcellulose esters of dibasic acids are available from Shin-Etsu Chemical Co., Ltd. of Japan.

When the cellulose ether is esterified by both the polybasic acid and monobasic acid, the esterification reaction is carried out by either of the following procedures. According to one of the procedures, the cellulose either is dispersed or dissolved in a carboxylic acid as the reaction medium, such as acetic acid, propionic acid, or butyric acid, followed by reaction with succinic anhydride and an anhydride of the aliphatic monocarboxylic acid in the presence of an alkali carboxylate, such as sodium acetate or potassium acetate, as the esterification catalyst. Alternatively, according to the other procedure, the cellulose ether is reacted with succinic anhydride and an anhydride of the aliphatic monocarboxylic acid as dispersed or dissolved in an organic solvent, such as acetone or dimethylformamide in the presence of a basic catalyst, such as pyridine or α-picoline. The organic solvent used in this case id preferred and possess a good dissolving power for the cellulose ether at least at a stage where the esterification reaction has proceeded to some extent.

In the former procedure, the cellulose ether as the base material is introduced into the reaction vessel together with about 100 to 2,000 parts by weight of the carboxylic acid as the reaction medium and about 20 to 200 parts by weight of the alkali carboxylate as the catalyst, all being expressed per 100 parts by weight of the cellulose ether, followed by further introduction of predetermined amounts of succinic anhydride and an anhydride of the aliphatic monocarboxylic acid, the resulting mixture being heated at about 60° to 110° C. for a period of time sufficient to complete the reaction, that is, usually from about 2 to 25 hours or longer.

In the latter procedure, 100 parts by weight of the cellulose ether as the starting material is dissolved or dispersed in 50 to 1,000 parts by weight of an organic solvent, such as acetone or dimethylformamide, containing the basic catalyst, such as pyridine and α-picoline, in an amount at least equivalent to the acid anhydrides to be reacted, followed by further addition of predetermined amounts of succinic anhydride and an anhydride of the monocarboxylic acid, the resulting mixture being heated at about 40° to 120° C. for 2 to 120 hours. After completion of the esterification reaction, a large volume of 5–15% sulfuric acid or hydrochloric acid is added to the reaction mixture to precipitate the reaction product, which is then washed with water thoroughly to remove impurities and dried to form a high purity powdery or granular product.

The two anhydrides, i.e., succinic anhydride and aliphatic monocarboxylic acid anhydride, may be introduced into the reaction vessel at the same time or separately one after the other during or after the reaction of either anhydride first introduced. The amount of each anhydride to be introduced is determined depending on the desired degree of esterification to be obtained in the final product, usually being 1.0 to 5.0 times the stoichiometric amounts.

In the above-described procedures for the esterification reaction, the cellulose ether as the starting material is not always soluble in the reaction medium, but can only be dispersed in or swollen by the carboxylic acid or organic solvent, especially, when the degree of substitution in the cellulose ether is relatively small. The esterification reaction can take place even with such a dispersed or swollen cellulose ether and, as the esterification reaction proceeds, the cellulose ether under reaction dissolves in the reaction medium, to finally give a homogeneous solution.

After completion of the esterification reaction, a large volume of water is added to the reaction mixture so that the reaction product is precipitated. The precipitated product is then subjected to thorough washing with water to remove impurities and dried to produce a mixed ester in the powdery or granular form of high purity.

As to the possible mode of the esterification reaction in the cellulose ethers as the base material, there may take place two types of the esterification reaction in the case of hydroxyalkyl- or hydroxyalkylalkyl-celluloses. Namely, the acid anhydrides, i.e., succinic anhydride and an anhydride of the aliphatic monocarboxylic acid can react with the hydroxy groups directly bonded to the glucosidic residue of the cellulose or react with the hydroxy groups at the end of the hydroxyalkyl groups $R^1$ in the above formula (I). No simple method is known for distinguishing one type of the ester groups from the other, and the conventional alkali hydrolysis followed by acid titration of the excess alkali only gives the total of both types of the ester groups.

The average degrees of substitution of the cellulose ether with the acidic succinyl and the aliphatic acyl groups per glucose unit may be controlled by the amounts of concentrations of the anhydrides in the reaction mixture, according to requirements in the properties of the mixed ester as the product. It is usually recommended that the average degree of substitution with acidic succinyl groups and the aliphatic acyl groups is in the range from 0.1 to 1.5 for the acidic succinyl groups or from 0.05 to 2.0 for the aliphatic monoacyl groups in order that the cellulose derivative can dissolve rapidly in alkaline solutions, such as photographic developing solutions, and that the coatings or films obtained therewith have sufficient flexibility. In particular, the ranges from 0.15 to 1.0 and from 0.1 to 1.8 for acidic succinyl groups and the aliphatic monoacyl groups, respectively.

The monocarboxylic acids suitable for this invention include but are not limited to acetic, propionic, butyric, and valeric acid. The anhydrides of said acids are also suitable. The anhydrides of acids having from 2 to 4 carbon atoms are preferred from the standpoint of commercial availability, cost, and ease of handling.

Mixed esters of hydroxyalkyl alkylcellulose with mono- and dibasic acids are available from Shin-Etsu Chemical Co., Ltd. of Japan. The hydroxypropyl methylcellulose acetate succinate (hereinafter called an HPMCAS resin) sold by Shin-Etsu under its mark AS-HG is particularly suitable. It has a methoxy content of 22–26%, a hydroxyproproxy content of 6–10%, an acetyl content of 10–14%, and a succinoyl content of 4–8% by weight. Its number average molecular weight is 33,000 and the Pd=1.7. Other HPMCAS resins having (on a weight basis) acetyl contents of from 5 to 14%, methoxy contents of from 20 to 26%, hydroxypropoxy contents of from 5 to 10%, and succinoyl contents of from 4 to 18% are also suitable as a binder resin for the dry film photoresist of this invention.

For the purposes of this invention, the term acrylate resin is defined to mean both acrylate and methacrylate resins. The acrylate resins which are suitable as part of the binder system for the positive acting dry film photoresist of this invention are copolymers of two or more of the following monomers: acrylic acid, methacrylic acid, alkyl acrylates, styrene, and α-methyl styrene. Thermally activated, free radical initiators such as, but not limited to, BPO (benzoyl peroxide) or AIBN (2,2'azobis(2-methyl-propionitrile)) are used to bring about solution polymerization of the acrylate monomeric units. When an acrylate resin is used in the binder resin system of this invention, one having a high acid number will help solubilize the PAG in the binder resin system but this must be balanced against the possibly unacceptable unexposed film loss at the development and the consequent poor contrast. Accordingly, the acid number may be from about 80 to about 240 mg KOH/gm. The molecular weight of the acrylate resin may be from about 20,000 to about 130,000 daltons. The amount of acrylate resin is inversely proportional to the acid number thereof at a given molecular weight. As much as 20% by weight of an acrylate resin having an acid number in the 200–240 range may be used but the amount may be increased to about 25% when the resin has an acid number below that range. The net glass transition temperature of the photosensitized acrylate resin based composition must be sufficiently high to prevent outgassing of nitrogen during exposure but not so high as to cause brittleness or reduce laminatability. As was said above, an acrylate resin having a $T_g$ of from about −10 to about 110° C. is suitable but a $T_g$ of from about −10 to about 60° C. is preferred.

The photoresist compositions of this invention may be formulated in solvents generally described as ketones, alcohols, esters, and ethers to obtain solutions having a percent solids ranging from 15 to 50. Methylethyl ketone (MEK), acetone, isopropanol, and ethyl lactate are examples of suitable solvents. Conventional plasticizers such as tributyl citrate and benzyl butyl phthalate may also be used in amounts ranging from about 0.1% to about 15% by weight solids. Adhesion promoters such as benzotriazole (BTR), a polymeric benzotriazole sold as poly(p-hydroxystyrene) benzotriazole (PHS-BZT) by Hoechst-Celanese, carboxy-benzotriazole (BTC), triphenyl phosphite (TPPT), and triphenyl phosphine (TPPN) may be used.

A monolayer dry film may be made by drawing down the resulting lacquer with a Baker bar at a setting of from about 4 to about 20 and drying it in a convection oven or tunnel dryer for about 2 to about 45 minutes at from about 35 to about 105° C. to obtain films ranging from about 0.5 mil to about 2.4 mils, preferably from about 0.8 to about 2 mils (from about 20 to about 50 microns) thick. The dry film may then be dry laminated or wet laminated (using water for example) onto either a copper clad dielectric substrate such as a polyimide film or a copper clad substrate such as an epoxy resin impregnated glass fiber board at room temperature or at an elevated temperature, e.g., 180° F. (82° C.). The copper may have a pumice scrubbed surface, a doubletreat surface, a drum-side treated surface (DSTF), a chemically microetched surface, a precleaned surface (caustic / sulfuric acid treatment), a non-precleaned (as received) surface, or it may be mechanically scrubbed. A Hot Roll (DYNACHEM Model 300 or 360) laminator may be used at a speed of 1 to 5 feet per minute, a roll pressure of 40 to 60 psi (0.28–0.41 MPa), and a roll temperature of 235 to 300° F. (113–150° C.). A post lamination bake may last for about 3 minutes at about 220° F. (105° C.) but it may be eliminated under certain conditions.

A printed circuit board may then be made by exposing the positive acting photoresist on the copper clad substrate to actinic radiation through a patterned photomask to define an image, dissolving the exposed portions of the resist in an alkaline developer to delineate the image, rinsing, and in some instances post-baking the imaged resist. Chemical etching or electroplating follows. The unexposed portions of the resist which cover the remaining copper foil may then be stripped away by a more active alkaline solvent to reveal the desired pattern of copper traces or plated features.

Conventional coating machines such as a 3-roll reverse coater having a metering roll which passes through the lacquer in a trough and wets a transfer roll and a backing roll which is wetted by the transfer roll and coats the substrate are particularly useful in the presensitizing coating of copper-clad dielectrics for electronic uses or of other substrates such as aluminum for printing plates. The dielectric for printed wiring board use can be a glass-epoxy construction, a polyimide, a liquid crystal polymer such as that sold under the trademark VECTRAN by Hoechst-Celanese, or the like. In one use of the present invention, a polyimide film has a copper layer adhered to one or both sides. A web of a copper-clad dielectric having an indefinite length may be rolled up to form a coil and both of the exposed copper faces of the web may be coated by paying it out from the coil and passing it through a first 3-roll coater, through an oven to dry the coated copper, passing the thus coated web through a second 3-roll coater disposed to coat the copper foil on the opposite side of the web, through a second drying oven, and recoiling the thus presensitized copper clad dielectric. Alternatively, the once coated web may be coiled up, turned end-for-end and the copper cladding on the opposite side coated in the first 3-roll coater. Another way for coating both sides of the copper clad dielectric as it is payed out from a coil thereof is to coat it in a 3-roll coater and dry the first side as described and turn the web over through 180° by passing it over a series of rollers having progressively greater inclinations and presenting the uncoated copper to the applicator roll as the web is led through the same 3-roll coater. The twice coated copper clad dielectric is passed through a drying oven again and then taken up again as a coil. It will be recognized that thin aluminum printing plate stock can be coated similarly with the positive acting resist composition of this invention. The positive acting photoresist composition of this invention may also be used to coat glass or quartz blanks to make masks as a step in the manufacture of chips. The positive acting composition of this invention may also be used a semiconductor resist on silicon wafers. Thus, this invention is useful in the manufacture of many different types of radiation sensitive recording materials which comprise a support and the positive acting photoresist composition described herein.

The photoresist may be exposed on a 5 kW HMW 201B unit having the following capacities: 1.1 mW/cm$^2$ at 240–270 nm; 5.9 mW/cm$^2$ at 320–390 nm; and 24.0 mW/cm$^2$ at 330–490 nm. The exposure dose is from about 150 to about 200 mJ/cm$^2$, preferably about 150 mJ/cm$^2$ for a dry film which is about 1.0 mil thick.

Development of the exposed resist may employ dilute aqueous solutions of a developing agent exemplified by sodium carbonate, potassium carbonate, sodium hydroxide, potassium hydroxide, a trialkanolamine, and other water soluble alkaline materials and mixtures thereof. The solutions may contain from about 0.25 to about 5% by weight of the developing agent, depending on its activity. The trialkanolamines are represented by the formula $(HOR^1)_3N$ wherein $R^1$ is an alkyl group having from 2 to 5 carbon atoms, preferably 2 or 3. Examples of the alkyl group include ethyl, n-propyl, isopropyl, butyl, and amyl. The most active of those named, sodium and potassium hydroxide, are preferably used at concentrations of from about 0.1 to about 1%. The carbonates are preferably used at concentrations of from about 0.2 to about 3%. The trialkanolamines are preferably used at concentrations of about 3% or less and more preferably from about 0.5 to about 1.5%. Semi-aqueous solutions of the developing agent and a water-miscible organic solvent such as, but not limited to, methanol, ethanol, isopropanol, and propylene glycol monomethyl ether may be utilized. Aqueous solutions of triethanolamine (99% pure) are preferred; one containing 1.25% of aqueous triethanolamine is particularly preferred. a temperature of about 85° F. (about 30° C.) is suitable. Among the various developer units that may be used are the CHEMCUT 413, the HOLLMULLER COMBISTEM unit and one sold under the trademark "The Little One". Spray pressure during development and rinsing may be from 5 to 24 psi (35 to 170 Pa). The development procedure may last for from 10 seconds to 10 minutes.

Etching of the exposed copper may be accomplished in a CHEMCUT 547 machine with a solution of cupric chloride in aqueous hydrochloric acid at about 120° F. and a spray pressure of 10–30 psi (70 to 210 Pa) for both etching and rinsing for about 80 seconds depending of the thickness of the copper deposited on the dielectric core.

The following descriptions of the preparation of an intermediate, a nitrated methylol alkylphenol, and of the diazonaphthoquinone sulfonate ester thereof is illustrative of the general procedure for making a photoacid generators suitable for this invention.

Preparation of 6-nitro-2-methylol p-cresol (NMC)

The 6-nitro-2-methylol p-cresol was prepared by charging 134.3 grams of bis-methylol para cresol (BMPC) (assay: 97.9%, melting point: 124.5 to 126.5° C.), and 3000 grams of deionized water into a 5 liter, wide mouth beaker and stirring to achieve a colloidal suspension of the BMPC before 200 grams of concentrated nitric acid was added in 30 minutes as the temperature was maintained between 20 and 30° C. The mixture was mixed an additional 24 hours at room temperature before a Büchner funnel filtration. The wetcake was washed with deionized water until the effluent achieved a pH of 6. The wetcake was then vacuum oven dried (30–35° C.,<10 torr) until the residual water assay was less than 1 percent. Yield: 80 to 85%.

Sulfonate of 6-nitro-2-methylol p-cresol

The diazonaphthoquinone sulfonate ester of NMC having an average of 2.0 sulfonate groups was obtained by charging 20 grams of the 6-nitro, 2-methylol p-cresol, 56.6 grams of 2,1,5-diazonaphthoquinone sulfonyl chloride, 390 grams of propylene glycol monomethyl ether (PM), and 165 grams of methylethyl ketone into a 1000 ml, three neck round bottom flask equipped with motor driven stirrer, material thermometer, ice/water cooling, and dropping funnel. After the contents of the three neck flask were cooled to 0 to 10° C., a separate solution of 21.4 grams of triethyl amine in 100 gms PM was added dropwise over 15 minutes. The flask contents were then mixed for an additional 3 hours while maintaining the temperature at 0 to 10° C. The reaction mixture was then added to 3300 gms of deionized water (0 to 10° C.) with mixing. Upon complete addition of the organic reaction mixture to the deionized water, the slurry was mixed an additional 10 minutes and Büchner funnel filtered. The wetcake was washed with an additional 1000 gms of deionized water. The wetcake was dried in a fluidized bed drier (50° C. air) until the residual water assay was determined to be less than 1%. Yield: >95%. The product is called 2.0f 215 DNQ sulfonate of NMC hereinafter.

The following examples illustrate the positive acting, dry film photoresist of this invention.

EXAMPLE 1

The following formulation was formed into a positive acting dry film photoresist and processed as follows (BORS means based on resin solids and BONV means based on non-volatiles at 80° C.):

| | |
|---|---|
| HPMCAS-HG (Shin-Etsu) | 80% of resin solids |
| Acrylate resin* | 20% of resin solids |
| 2.0 f 215 DNQ Ester of NMC | 18% BORS |
| Triphenyl Phosphite | 4% BORS |
| MEK/Ethyl Lactate (75:25)$_{wt\%}$ | 512% BORS |

* A solution polymerized resin made from 30.3% acrylic acid, 12.7% 2-ethylhexyl acrylate, 57.0% styrene, all by weight, and 0.76 mole percent BPO. Acid #: 235.9, Tg: 60° C., Mw: 24,000

| | |
|---|---|
| %$_{wt}$ Final Solids | 19.25 |
| Baker Bar Setting | 6 |
| Convection Oven Drying | 105° C./3 minutes |
| Coated Thickness | 0.6 mil |
| Copper Surface | Mechanical Scrub |
| Preheat Before Lamination | 180° F. Equilibrated |
| Laminator | DYNACHEM Hot Roll Model 360 |
| Lamination Speed | 2.5 Ft/Minute |
| Lamination Roll Pressure | 60 psi |
| Lamination Roll Temperature | 300° F. |
| Post Lamination Bake | 105° C./3 Minutes |
| Exposure Unit | HMW 201B 5 kW |
| | 1.1 mW/cm$^2$ (24014 270 nm) |
| | 5.9 mW/cm$^2$ (320–390 nm) |
| | 24.0 mW/cm$^2$ (33014 490 nm) |
| Exposure Dose (on contact) | 200 mJ/cm$^2$ |
| Developer Unit | Chemcut 413 |
| Development Chemistry | Sodium Carbonate (1.0%) |
| Development Temperature | 85° F. |
| Development Spray Pressure | Develop (10 psi) |
| | Rinse (10 psi) |
| Development Duration | 60 seconds |
| Acid Etcher | CHEMCUT 547 |
| Acid Etchant | Cupric Chloride (2 N HCl) |
| Acid Etch Temperature | 120° F. |
| Acid Etchant Spray Pressure | Etch (30 psi) |
| | Rinse (30 psi) |
| Acid Etch Duration | 78 seconds |

EXAMPLE 2

The formulation, process, and attributes of another positive acting, dry film photoresist of this invention are as follows:

| | |
|---|---|
| HPMCAS-HG | 80% of resin solids |
| Acrylate resin of Example 1 | 20% of resin solids |
| 2.0 f 215 DNQ Ester of NMC | 10% BORS |
| Tributyl Citrate | 20% BORS |
| MEK | 265% BORS |
| %$_{wt}$ Final Solids | 25.3 |
| Baker Bar Setting | 6 |
| Convection Oven Dyring | 105° C./3 minutes |
| Coated Thickness | 0.7 to 0.8 mil |
| Copper Surface | Mechanical Scrub |
| Preheat Before Lamination | 180° F. Equilibrated |
| Laminator | DYNACHEM Model 360 |
| Lamination Speed | 2.0 Ft/Minute |
| Lamination Roll Pressure | 60 psi |
| Lamination Roll Temperature | 130° C. (265° F.) |
| Exposure Unit | HMW 201B 5 kW |
| | 1.1 mW/cm$^2$(240–270 nm) |
| | 5.9 mW/cm$^2$(320–390 nm) |
| | 24.0 mW/cm$^2$(330–490 nm) |
| Exposure Dose (on contact) | 150 mJ/cm$^2$ |
| Developer Unit | Agitated Immersion |
| Development Chemistry | Aqueous Triethanol Amine (1.0%) |
| Development Temperature | 85° F. |
| Development Duration | 60 seconds |

An evaluation of the dry film showed no evidence of adhesion failure for 2/2, 2/4, 2/4 mil (linewidth/spacewidth) features. The unexposed film loss was 10 to 15 percent.

EXAMPLE 3

Another dry film of this invention was made and processed as follows:

| | |
|---|---|
| HPMCAS-HG | 80% of resin solids |
| Acrylate resin of Example 1 | 20% of resin solids |
| 2.0 f 215 DNQ Ester of NMC | 10% BORS |
| MEK | 394% BORS |
| %$_{wt}$ Final Solids | 21.82 |
| Baker Bar Setting | 8 |
| Convection Oven Dyring | 80° C./3 minutes |
| Coated Thickness | 0.93 mil |
| Copper Surface | Mechanical Scrub, 1/1, 0.059, FR4 |
| Preheat Before Lamination | 180° F./3 Min |
| Laminator | DYNACHEM Model 360 |
| Lamination Speed | 2.0 Ft/Minute |
| Lamination Roll Pressure | 60 psi |
| Lamination Roll Temperature | 265° F.(130° C.) |
| Post Lamination Bake | None |
| Exposure Unit | HMW 201B 5 kW-Non Collimated |
| | 1.1 mW/cm$^2$ (240–270 nm) |
| | 5.9 mW/cm$^2$ (320–390 nm) |
| | 24.0 mW/cm$^2$(330–490 nm) |
| Exposure Dose (on contact) | 150 mJ/cm$^2$ |
| Post Exposure Bake | None |
| Developer Unit | The Little One |
| Development Chemistry | Triethanolamine (2%) |
| | Propylene Glycol Mono Methyl Ether (8%) |
| Development Temperature | 85° F. |
| Development Spray Pressure | Develop (15 psi) |
| | Rinse (15 psi) |
| Development Duration | 78 seconds |

The product, when processed as described above, achieved the following performance characteristics after development:

| | |
|---|---|
| Adhesion | 15 $\mu$m/400 $\mu$m (Line Width/Space Width) |
| Resolution | 15 $\mu$m/15 $\mu$m; 400 $\mu$m/15 $\mu$m |
| Unexposed Film Loss | 2.2% |
| Resist Thickness After Development | 0.91 mil |

-continued

| | |
|---|---|
| Aspect Ratio (Resist Thickness/Resolved Feature Size) | 22.75 μm/15 μm = 1.52 |

EXAMPLE 4

Another dry film of this invention was made and processed as follows:

| | |
|---|---|
| HPMCAS-HG | 80% of resin solids |
| Acrylate resin of Example 1 | 20% of resin solids |
| 2.0 f 215 DNQ Ester of NMC | 10% BORS |
| MIBK | 33% BORS |
| MEK | 394% BORS |
| % Final Solids | 20.47 |
| Baker Bar Setting | 8 |
| Convectjon Oven Dyring | 80° C./2 minutes |
| Coated Thickness | 0.9 mil |
| Copper Surface | Not Precleaned, 5 micron/5 micron, 0.002, Polyimide |
| Preheat Before Lamination | None |
| Laminator | DYNACHEM Model 724 (vacuum) |
| Lamination Cycle Time | 50 Seconds |
| Lamination Slap-Down Period | 4 Seconds |
| Lamination Platen Temperature | 203° F. (95° C.) |
| Post Lamination Bake | None |
| Exposure Unit | HMW 201B 5 kW-Non Collimated 1.1 mW/cm² (240–270 nm) 5.9 mW/cm² (320–390 nm) 24.0 mW/cm² (330–490 nm) |
| Exposure Dose (on contact) | 150 mJ/cm² |
| Post Exposure Bake | None |
| Developer Unit | The Little One |
| Development Chemistry | Triethanolamine (2%) Propylene Glycol Mono Methyl Ether (8%) Water (90%) |
| Development Temperature | 85° F. |
| Development Spray Pressure | Develop (15 psi) Rinse (15 psi) |
| Development Duration | 50 seconds |

The product, when processed as described above, achieved the following performance characteristics after development:

| | |
|---|---|
| Adhesion | 15 μm/400 μm (line width/space width) |
| Resolution | 15 μm/15 μm; 400 μm/15 μm |
| Unexposed Film Loss | 15–20% |
| Aspect Ratio | 1.2 (18.0 μm/15 μm |

EXAMPLE 5

The formulation of Example 4, except that the PAG was replaced with 215DNQTHB, was processed in the following manner:

| | |
|---|---|
| % Final Solids | 20.47 |
| Baker Bar Setting | 8 |
| Convection Oven Drying | 80° C./2 minutes |
| Coated Thickness | 0.9 mil |
| Copper Surface | Not Precleaned, 5 micron/5 micron, 0.002, Polyimide |
| Preheat Before Lamination | None |
| Laminator | Vacuum Laminator Dynachem Model 724 |
| Larnination Cycle Time | 50 Seconds |
| Lamination Slap-Down Period | 4 Seconds |
| Lamination Platen Temperature | 203° F. (95° C.) |

-continued

| | |
|---|---|
| Post Lamination Bake | None |
| Exposure Unit | HMW 201B 5 kW-Non Collimated 1.1 mW/cm² (240–270 nm) 5.9 mW/cm² (320–390 nm) 24.0 mW/cm² (330–490 nm) |
| Exposure Dose (on contact) | 150 mJ/cm² |
| Post Exposure Bake | None |
| Developor Unit | The Little One |
| Development Chemistry | Triethanolamine (2%) Propylene Glycol Mono Methyl Ether (8%) |
| Development Temperature | 85° F. |
| Development Spray Pressure | Develop (15 psi) Rinse (15 psi) |
| Development Duration | 50 seconds |

The product, when processed as described above, achieved similar performance as described in Example 4.

EXAMPLE 6

Another dry film of this invention was made and processed as follows:

| | |
|---|---|
| Shin-Etsu HPMCAS-HG | 100% Resin Solids |
| 215DNQTHB | 10% BORS |
| Tributyl Citrate | 12.5% BONV |
| Flexo Blue 680 | 0.22% BONV |
| MEK | 442% BONV |
| % Final Solids | 22.18 |
| Baker Bar Setting | 8 |
| Tunnel Oven Dying | 90° F./10 minutes |
| Coated Thickness | 1.0 mil |
| Copper Surface | Mechanical Scrub, 1/1, 0.059, FR4 |
| Preheat Before Lamination | 180° F./3 Min |
| Laminator | Hot Roll Model 300 |
| Lamination Speed | 2.0 Ft/Minute |
| Lamination Roll Pressure | 40 psi |
| Lamination Roll Temperature | 235° F.(113° C.) |
| Post Lamination Bake | None |
| Exposure Unit | HMW 201B 5 kW-Non Collimated 1.1 mW/cm² (240–270 nm) 5.9 mW/cm² (320–390 nm) 24.0 mW/cm² (330–490 nm) |
| Exposure Dose (on contact) | 150 mJ/cm² |
| Post Exposure Bake | None |
| Developer Unit | The Little One |
| Development Chemistry | Triethanolamine (0.5%), water (99.5%) |
| Development Temperature | 85° F. |
| Development Spray Pressure | Develop (15 psi) Rinse (15 psi) |
| Development Duration | 55 Seconds |

The product, when processed as described above, achieved the following performance characteristics after development:

| | |
|---|---|
| Adhesion | 15 μm/400 μm (Line Width/Space Width) |
| Resolution | 15 μm/15 μm; 400 μm/15 μm |
| Unexposed Film Loss | 20% |
| Aspect Ratio | 18.0 μm/15 μm = 1.2 |

EXAMPLE 7

Another dry film of this invention was made and processed as follows:

| | |
|---|---|
| Shin-Etsu HPMCAS-HG | 100% Resin Solids |
| 215DNQTHB | 10% BORS |

| | |
|---|---|
| Benzotriazole (BTR) | 2.4% BONV |
| Flexo Blue 680 | 0.22% BONV |
| MEK | 437% BONV |
| % Final Solids | 20.55 |
| Baker Bar Setting | 8 |
| Convection Oven Drying | 80° C./10 minutes |
| Coated Thickness | 0.9 mil |
| Copper Surface | Mechanical Scrub, 1/1, 0.059, FR4 |
| Preheat Before Lamination | None |
| Laminator | Hot Roll Model 300 |
| Lamination Speed | 2.0 Ft/Minute (Wet Lamination-Water Used) |
| Lamination Roll Pressure | 40 psi |
| Lamination Roll Temperature | 235° F.(113° C.) |
| Post Lamination Bake | None |
| Exposure Unit | HMW 201B 5 kW-Non Collimated 1.1 mW/cm$^2$ (240–270 nm) 5.9 mW/cm$^2$ (320–390 nm) 24.0 mW/cm$^2$ (330–490 nm) |
| Exposure Dose (on contact) | 150 mJ/cm$^2$ |
| Post Exposure Bake | None |
| Developer Unit | The Little One |
| Development Chemistry | Triethanolamine (0.5%), water (99.5%) |
| Development Temperature | 75° F. |
| Development Spray Pressure | Develop (15 psi) Rinse (15 psi) |
| Development Duration | 240 Seconds |

The product, when processed as described above, achieved the following performance characteristics after development:

| | |
|---|---|
| Adhesion | 5 μm/400 μm (Line Width/Space Width) |
| Resolution | 10 μm/10 μm; 400 μ/10 m |
| Unexposed Film Loss | <2% |
| Aspect Ratio | 22.5 μm/10 μm = 2.5 |

EXAMPLE 8

Another dry film of this invention was made and processed as follows:

| | |
|---|---|
| Shin-Etsu HPMCAS-HG | 100% Resin Solids |
| 215DNQTHB | 10% BORS |
| Flexo Blue 680 | 0.22% BONV |
| MEK | 443% BONV |
| % Final Solids | 19.91 |
| Copper Surface | No Preclean, 5 micron/5 micron, 0.002, Polyimide |
| Application Method | Draw-Down Directly Onto Copper Clad Substrate |
| Baker Bar Setting | 8 |
| Convection Oven Drying | 80° C./5 minutes |
| Coated Thickness | 1.0 mil |
| Exposure Unit | HMW 201B 5 kW-Non Collimated 1.1 mW/cm$^2$ (240–270 nm) 5.9 mW/cm$^2$ (320–390 nm) 24.0 mW/cm$^2$ (330–490 nm) |
| Exposure Dose (on contact) | 150 mJ/cm$^2$ |
| Post Exposure Bake | None |
| Developer Unit | The Little One (Panels Supported Through Develop Unit) |
| Development Chemistry | Triethanolamine (1.25%), water (98.75%) |
| Development Temperature | 85° F. |
| Development Spray Pressure | Develop (15 psi) Rinse (15 psi) |
| Development Duration | 48 Seconds |

The product, when processed as described above, achieved the following performance characteristics after development:

| | |
|---|---|
| Adhesion | 5 μm/400 μm (Line Width/Space Width) |
| Resolution | 5 μm/5 μm; 400 μm/5 μm |
| Unexposed Film Loss | <2% |
| Aspect Ratio | 22.5 μm/10 μm = 2.25 |

EXAMPLE 9

Another dry film of this invention was made and processed as follows:

| | |
|---|---|
| Shin-Etsu HPMCAS-HG | 100% Resin Solids |
| 215DNQTHB | 10% BORS |
| Flexo Blue 680 | 0.22% BONV |
| MEK | 341% BONV |
| % Final Solids | 24.4 |
| Baker Bar Setting | 8 |
| Convection Oven Drying | 80° C./5 minutes |
| Coated Thickness | 1.0 mil |
| Copper Surface | Mechanical Scrub, 1/1, 0.059, FR4 |
| Preheat Before Lamination | None |
| Laminator | Hot Roll Model 300 |
| Lamination Speed | 2.0 Ft/Minute (Wet Lamination-Water Used) |
| Lamination Roll Pressure | 40 psi |
| Lamination Roll Temperature | 235° F.(113° C.) |
| Post Lamination Bake | None |
| Exposure Unit | HMW 201B 5 kW-Non Collimated 1.1 mW/cm$^2$ (240–270 nm) 5.9 mW/cm$^2$ (320–390 nm) 24.0 mW/cm$^2$ (330–490 nm) |
| Exposure Dose (on contact) | 150 mJ/cm$^2$ |
| Post Exposure Bake | None |
| Developer Unit | The Little One |
| Development Chemistry | Triethanolamine (1.25%), water (98.75%) |
| Development Temperature | 85° F. |
| Development Spray Pressure | Develop (15 psi) Rinse (15 psi) |
| Development Duration | 50 Seconds |

The product, when processed as described above, achieved the following performance characteristics after development:

| | |
|---|---|
| Adhesion | 5 μm/400 μm (Line Width/Space Width) |
| Resolution | 5 μm/5 μm; 400 μm/5 μm |
| Unexposed Film Loss | <2% |
| Aspect Ratio | 22.5 μm/10 μm = 2.25 |

The subject matter claimed is:

1. A positive acting photoresist composition comprising a photoacid generator and (a) an acid functional cellulosic resin having the structure

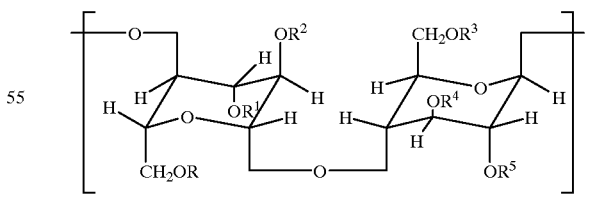

wherein R, R$^1$, R$^2$, R$^3$, R$^4$, and R$^5$ are hydrogen, alkyl, hydroxyalkyl, acyl, or —C(=O)R'(COOR")$_m$ in which R' is alkylene, phenylene, or cyclohexylene, and m is 1 or 2; when m is 1, R" is hydrogen, and when m is 2, at least one R" is hydrogen while the other is alkyl having from 1 to 4 carbon atoms; with the proviso that at least one of R, R$^1$, R$^2$, R$^3$, R$^4$, and R$^5$ is —C(=O)R'

(COOR")$_m$, and that at least one other of R, R$^1$, R$^2$, R$^3$, R$^4$, and R$^5$ is alkyl, hydroxyalkyl, acyl, or —C(=O)R'(COOR")$_m$, and (b) from 0 to 25% by weight of an acidic acrylate resin, based on the combined weight of the resins; and wherein resins (a) and (b) are the sole binders.

2. The composition of claim 1 wherein the acrylate resin has a T$_g$ of from about –10° to about 110° C.

3. The composition of claim 1 wherein the amount of binder resin (b) is 0%.

4. The composition of claim 1 wherein the acrylate resin has an acid number of from about 80 to about 240.

5. The composition of claim 1 wherein the alkylene group represented by R' has 2 or 3 carbon atoms.

6. The composition of claim 1 wherein the photoacid generator is a diazoquinone sulfonyl ester of trihydroxybenzophenone.

7. The composition of claim 1 wherein the photoacid generator is a diazoquinone sulfonyl ester of 6-nitro-2-methylol p-cresol.

8. The composition of claim 1 wherein the photoacid generator is a triarylsulfonium hexafluoroantimonate.

9. The composition of claim 1 wherein the alkyl group represented by R has from 1 to 6 carbon atoms.

10. The composition of claim 1 wherein the hydroxyalkyl group has from 2 to 6 carbon atoms.

11. The composition of claim 1 wherein the acyl group has from 2 to 4 carbon atoms.

12. The composition of claim 1 wherein m is 1.

13. The composition of claim 1 wherein hydrogen, alkyl, hydroxyalkyl, acyl, and —C(=O)R'(COOR")$_m$ are simultaneous substituents.

14. The composition of claim 1 wherein the photoacid generator is a diazoquinone sulfonyl ester of 6-nitro-2-methylol p-cresol; the amount of binder resin (b) is 0%; and hydrogen, methyl, hydroxpropyl, acetyl, and —C(=O)R'(COOR")$_m$ are simultaneous substituents wherein m is 1 and R' is alkylene.

15. A copper clad dielecric presensitiized with a positive acting photoresist composition comprising a photoacid generator and (a) an acid functional cellulosic resin having the structure

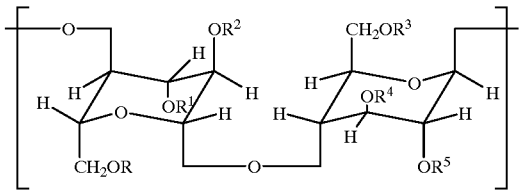

wherein R, R$^1$, R$^2$, R$^3$, R$^4$, and R$^5$ are hydrogen, alkyl, hydroxyalkyl, acyl, or —C(=O)R'(COOR")$_m$ in which R' is alkylene, phenylene, or cyclohexylene, and m is 1 or 2; when m is 1, R" is hydrogen, and when m is 2, at least one R" is hydrogen while the other is alkyl having from 1 to 4 carbon atoms; with the proviso that at least one of R, R$^1$, R$^2$, R$^3$, R $^4$, and R$^5$ is —C(=O)R'(COOR")$_m$, and that at least one other of R, R$^1$, R$^2$, R$^3$, R$^4$, and R$^5$ is alkyl, hydroxyalkyl, acyl, or —C(=O)R'(COOR")$_m$; and (b) from 0 to 25% by weight of an acidic acrylate resin, based on the combined weight of the resins. and wherein resins (a) and (b) are the sole binders.

16. The copper clad dielectric of claim 15 wherein the acrylate resin has a T$_g$ of from about –10° to about 110° C.

17. The copper clad dielectric of claim 15 wherein the amount of binder resin (b) is 0%.

18. The copper clad dielectric of claim 15 wherein the acrylate resin has an acid number of from about 80 to about 240.

19. The copper clad dielectric of claim 15 wherein the positive acting photoresist composition is a monolayer.

20. The copper clad dielectric of claim 15 wherein the photoacid generator is a diazoquinone sulfonyl ester of trihydroxybenzophenone.

21. The copper clad dielectric of claim 15 wherein the photoacid generator is a diazoquinone sulfonyl ester of 6-nitro-2-methylol p-cresol.

22. The copper clad dielectric of claim 15 wherein the photoacid generator is a triarylsulfonium hexafluoroantimonate.

23. The copper clad dielectric of claim 15 wherein the alkyl group represented by R has from 1 to 6 carbon atoms.

24. The copper clad dielectric of claim 15 wherein the hydroxyalkyl group has from 2 to 6 carbon atoms.

25. The copper clad dielectric of claim 15 wherein the acyl group has from 2 to 4 carbon atoms.

26. The copper clad dielectric of claim 15 wherein the alkylene group represented by R' has 2 or 3 carbon atoms.

27. The copper clad dielectric of claim 15 wherein hydrogen, alkyl, hydroxyalkyl, acyl, and —C(=O)R' (COOR")$_m$ are simultaneous substituents.

28. The copper clad dielectric of claim 15 wherein the photoacid generator is a diazoquinone sulfonyl ester of 6-nitro, 2-methylol p-cresol; the amount of binder resin (b) is 0%; substituents represented by R, R$^1$, R$^2$, R$^3$, R$^4$, and R$^5$ are simultaneously hydrogen, methyl, hydroxypropyl, acetyl, and —C(=O)R'(COOR")$_m$ wherein m is 1 and R' is alkylene.

29. A radiation sensitive recording material which comprises a support and a monolayer of a positive acting photoresist thereon, said photoresist comprising a photoacid generator and (a) an acid functional cellulosic resin having the structure wherein R, R$^1$, R$^2$, R$^3$, R$^4$, and R$^5$ are hydrogen, alkyl, hydroxyalkyl, acyl, or —C(=O)R'(COOR")$_m$ in which R' is alkylene, phenylene, or cyclohexylene, and m is 1 or 2; when m is 1, R" is hydrogen, and when m is 2, at least one R" is hydrogen while the other is alkyl having from 1 to 4 carbon atoms; with the proviso that at least one of R$^3$, R$^1$, R$^2$, R R$^4$, and R$^5$ is —C(=O)R' (COOR")$_m$, and that at least one other of R, R$^1$, R$^2$, R$^3$, R$^4$, and R$^5$ is alkyl, hydroxyalkyl, acyl, or —C(=O) R'(COOR")$_m$; and (b) from 0 to 25% by weight of an acidic acrylate resin, based on the combined weight of the resins; and wherein resins (a) and (b) are the sole binders.

30. The radiation sensitive recording material of claim 29 wherein the acrylate resin has a T$_g$ of from about –10° to about 110° C.

31. The radiation sensitive recording material of claim 29 wherein the amount of binder resin (b) is 0%.

32. The radiation sensitive recording material of claim 29 wherein the acrylate resin has an acid number of from about 80 to about 240.

33. The radiation sensitive recording material of claim 29 wherein the alkylene group represented by R' has 2 or 3 carbon atoms.

34. The radiation sensitive recording material of claim 29 wherein the photoacid generator is a diazoquinone sulfonyl ester of trihydroxybenzophenone.

35. The radiation sensitive recording material of claim 29 wherein the photoacid generator is a diazoquinone sulfonyl ester of 6-nitro-2-methylol p-cresol.

36. The radiation sensitive recording material of claim 29 wherein the photoacid generator is a triarylsulfonium hexafluoroantimonate.

37. The radiation sensitive recording material of claim 29 wherein the alkyl group represented by R has from 1 to 6 carbon atoms.

38. The radiation sensitive recording material of claim 29 wherein the hydroxyalkyl group has from 2 to 6 carbon atoms.

39. The radiation sensitive recording material of claim 29 wherein the acyl group has from 2 to 4 carbon atoms.

40. The radiation sensitive recording material of claim 33 wherein the alkylene group has 2 carbon atoms.

41. The radiation sensitive recording material of claim 29 wherein hydrogen, alkyl hydroxyalkyl, acyl, and —C(═O)R'(COOR")$_m$ are simultaneous substituents.

42. The radiation sensitive recording material of claim 29 wherein the photoacid generator is a diazoquinone sulfonyl ester of 6-nitro-2-methylol p-cresol; the amount of binder resin (b) is 0%; and hydrogen, methyl, hydroxypropyl, acetyl, and —C(═O)R'(COOR")$_m$ are simultaneous substituents wherein m is 1 and R' is alkylene.

43. A monolayer dry film of a positive acting photoresist comprising a photoacid generator and (a) an acid functional cellulosic resin having the structure

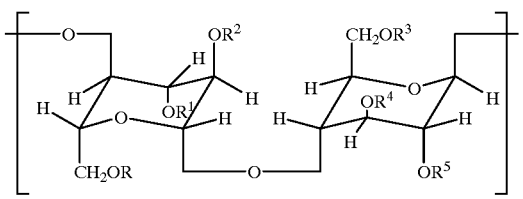

wherein R, R$^1$, R$^2$, R$^3$, R$^4$, and R$^5$ are hydrogen, alkyl, hydroxyalkyl, acyl, or —C(═O)R'(COOR")$_m$ in which R' is alkylene, phenylene, or cyclohexylene, and m is 1 or 2; when m is 1, R" is hydrogen, and when m is 2, at least one R" is hydrogen while the other is alkyl having from 1 to 4 carbon atoms; with the proviso that at least one of R, R$^1$, R$^2$, R$^3$, R$^4$, and R$^5$ is —C(═O)R' (COOR")$_m$, and that at least one other of R, R$^1$, R$^2$, R$^3$, R$^4$, and R$^5$ is alkyl, hydroxyalkyl, acyl, or —C(═O)R'(COOR")$_m$; and (b) from 0 to 25% by weight of an acidic acrylate resin, based on the combined weight of the resins; and wherein resins (a) and (b) are the sole binders.

44. The dry film of claim 43 wherein the acrylate resin has a T$_g$ of from about –10° to about 110° C.

45. The dry film of claim 43 wherein the amount of binder resin (b) is 0%.

46. The dry film of claim 43 wherein the acrylate resin has an acid number of from about 80 to about 240.

47. The dry film of claim 43 wherein the alkylene group represented by R' has 2 or 3 carbon atoms.

48. The dry film of claim 43 wherein the photoacid generator is a diazoquinone sulfonyl ester of trihydroxybenzophenone.

49. The dry film of claim 43 wherein the photoacid generator is a diazoquinone sulfonyl ester of 6-nitro-2-methylol p-cresol.

50. The dry film of claim 43 wherein the photoacid generator is a triarylsulfonium hexafluoroantimonate.

51. The dry film of claim 43 wherein the alkyl group represented by R has from 1 to 6 carbon atoms.

52. The dry film of claim 43 wherein the hydroxyalkyl group has from 2 to 6 carbon atoms.

53. The dry film of claim 43 wherein the acyl group has from 2 to 4 carbon atoms.

54. The dry film of claim 43 wherein hydrogen, alkyl, hydroxyalkyl, acyl, and —C(═O)R'(COOR")$_m$ are simultaneous substituents.

55. The dry film of claim 47 wherein the photoacid generator is a diazoquinone sulfonyl ester of 6-nitro-2-methylol p-cresol; the amount of binder resin (b) is 0%; and hydrogen, methyl, hydroxypropyl, acetyl, and —C(═O)R' (COOR")$_m$ are simultaneous substituents wherein m is 1 and R' is alkylene.

56. The composition of claim 1 further comprising from about 0.1% to 15% by weight solids of a plasticizer.

57. The composition of claim 56 wherein the plasticizer is benzyl butyl phthalate.

* * * * *